US006958247B2

(12) United States Patent
Marxsen et al.

(10) Patent No.: US 6,958,247 B2
(45) Date of Patent: Oct. 25, 2005

(54) METHOD OF ELECTROPLATING COPPER OVER A PATTERNED DIELECTRIC LAYER TO ENHANCE PROCESS UNIFORMITY OF A SUBSEQUENT CMP PROCESS

(75) Inventors: Gerd Marxsen, Radebeul (DE); Axel Preusse, Radebeul (DE); Markus Nopper, Dresden (DE); Frank Mauersberger, Radebeul (DE)

(73) Assignee: Advanced Micro Devices, Inc., Austin, TX (US)

( * ) Notice: Subject to any disclaimer, the term of this patent is extended or adjusted under 35 U.S.C. 154(b) by 90 days.

(21) Appl. No.: 10/666,195

(22) Filed: Sep. 19, 2003

(65) Prior Publication Data

US 2004/0214423 A1 Oct. 28, 2004

(30) Foreign Application Priority Data

Apr. 28, 2003 (DE) ................................ 103 19 135

(51) Int. Cl.[7] .................. H01L 21/461; H01L 21/4763
(52) U.S. Cl. .......................................... 438/8; 438/633
(58) Field of Search ............................ 438/8, 500, 502, 438/618, 620, 622, 626, 631, 633, 638, 687, 438/692, 7

(56) References Cited

U.S. PATENT DOCUMENTS

| | | | | |
|---|---|---|---|---|
| 5,232,575 | A * | 8/1993 | Dodd | 205/238 |
| 6,179,691 | B1 | 1/2001 | Lee et al. | 451/41 |
| 6,346,479 | B1 | 2/2002 | Woo et al. | 438/687 |
| 6,350,364 | B1 | 2/2002 | Jang | 205/118 |
| 6,444,110 | B2 * | 9/2002 | Barstad et al. | 205/123 |
| 2001/0015321 | A1 | 8/2001 | Reid et al. | 205/103 |
| 2002/0175080 | A1 | 11/2002 | Teerlinck et al. | 205/291 |
| 2002/0195351 | A1 | 12/2002 | Lu et al. | 205/574 |
| 2003/0080000 | A1 * | 5/2003 | Robertson | 205/775 |
| 2003/0162399 | A1 * | 8/2003 | Singh | 438/692 |
| 2003/0221966 | A1 * | 12/2003 | Bonkass et al. | 205/103 |
| 2004/0012090 | A1 * | 1/2004 | Basol et al. | 257/755 |
| 2004/0094511 | A1 * | 5/2004 | Seo et al. | 216/83 |

FOREIGN PATENT DOCUMENTS

| | | | |
|---|---|---|---|
| EP | 1 191 128 A2 | 3/2002 | C25D 5/08 |
| WO | WO 03/009361 A2 | 1/2003 | H01L 21/288 |

OTHER PUBLICATIONS

Cerisier et al., "Growth Mode of Copper Films Electrodeposited on Silicon from Sulfate and Pyrophosphate Solutions," *J. Electrochem. Soc.*, 146:2156-62, 1999.
Data Sheets (in German) "Polyether" and "Polyalkylene Glycol", 2003.
Reid et al., "Factors Influencing Damascene Feature Fill Using Copper PVD and Electroplating," *Solid State Technology*, pp. 86-103, Jul. 2000.
Hong et al., "Developing Metrology for Controlling Cu-electroplating Additives," *Solid State Technology*, pp. 57-59, Oct. 2002.

(Continued)

*Primary Examiner*—Laura M Schillinger
*Assistant Examiner*—Jennifer M. Dolan
(74) *Attorney, Agent, or Firm*—Williams, Morgan & Amerson, P.C.

(57) ABSTRACT

In a new method of plating metal onto dielectric layers including small diameter vias and large diameter trenches, a surface roughness is created at least on non-patterned regions of the dielectric layer to enhance the uniformity of material removal in a subsequent chemical mechanical polishing (CMP) process.

18 Claims, 3 Drawing Sheets

OTHER PUBLICATIONS

Banerjee et al., "Simultaneous Optimization of Electroplating and CMP for Copper Processes," *Solid State Technology*, pp. 83-88, Nov. 2001.

Smekalin et al., "Tuning the Process Flow to Optimize Copper CMP, *Solid State Technology*" , pp. 107-112, Sep. 2001.

* cited by examiner

METHOD OF ELECTROPLATING COPPER OVER A PATTERNED DIELECTRIC LAYER TO ENHANCE PROCESS UNIFORMITY OF A SUBSEQUENT CMP PROCESS

BACKGROUND OF THE INVENTION

1. Field of the Invention

The present invention generally relates to the fabrication of integrated circuits, and, more particularly, to the formation of metallization layers, wherein a metal is deposited over a patterned dielectric layer and excess metal is subsequently removed by chemical mechanical polishing (CMP).

2. Description of the Related Art

In every new generation of integrated circuits, device features are further reduced, whereas the complexity of the circuits steadily increases. Reduced feature sizes not only require sophisticated photolithography methods and advanced etch techniques to appropriately pattern the circuit elements, but also places an ever-increasing demand on deposition techniques. Presently, the minimum feature sizes approach 0.1 $\mu$m or even less, which allows the fabrication of fast-switching transistor elements covering only a minimum of chip area. However, as a consequence of the reduced feature sizes, the available floor space for the required metal interconnects decreases while the number of necessary interconnections between the individual circuit elements increases. As a result, the cross-sectional area of metal connects decreases and this makes it necessary to replace the commonly used aluminum by a metal that allows a higher current density at a reduced electrical resistivity to obtain reliable chip interconnects with high quality. In this respect, copper has proven to be a promising candidate due to its advantages, such as low resistivity, high reliability, high heat conductivity, relatively low cost and a crystalline structure that may be controlled to obtain relatively large grain sizes. Furthermore, copper shows a significantly higher resistance against electromigration and, therefore, allows higher current densities while the resistivity is low, thus allowing the introduction of lower supply voltages.

Despite the many advantages of copper compared to aluminum, semiconductor manufacturers in the past have been reluctant to introduce copper into the manufacturing sequence for several reasons. One major issue in processing copper in a semiconductor line is the copper's capability of readily diffusing in silicon and silicon dioxide at moderate temperatures. Copper diffused into silicon may lead to a significant increase in the leakage current of transistor elements, since copper acts as a deep-level trap in the silicon band-gap. Moreover, copper diffused into silicon dioxide may compromise the insulating properties of silicon dioxide and may lead to higher leakage currents between adjacent metal lines, or may even form shorts between neighboring metal lines. Thus, great care must be taken to avoid any contamination of silicon wafers with copper during the entire process sequence.

A further issue arises from the fact that copper may not be effectively applied in greater amounts by deposition methods, such as physical vapor deposition (PVD) and chemical vapor deposition (CVD), which are well-known and well-established techniques in depositing other materials, such as aluminum. Accordingly, copper is now commonly applied by a wet process, such as electroplating, which provides, compared to electroless plating, the advantages of a higher deposition rate and a less complex electrolyte bath. Although at a first glance electroplating seems to be a relatively simple and well-established deposition method due to the great amount of experience gathered in the printed wiring board industry during decades, the demand of reliably filling high aspect ratio openings with dimensions of 0.1 $\mu$m and less, as well as wide trenches having a lateral extension in the order of micrometers, renders electroplating of copper, as well as other metals that may be used in metallization layers, a highly complex deposition method, in particular as subsequent process steps, such as chemical mechanical polishing and any metrology processes, directly depend on the quality of the electroplating process.

With reference to FIGS. 1*a*–1*b*, a typical process sequence for manufacturing a metallization layer will now be described. According to FIG. 1*a*, a semiconductor device 100 comprises a substrate 101 including circuit elements, such as transistors, resistors, capacitors and the like, which, for the sake of simplicity, are not depicted in FIG. 1*a*. A dielectric layer 102 is formed above the substrate 101 and is separated therefrom by an etch stop layer 103. For example, the dielectric layer 102 may be comprised of silicon dioxide, whereas the etch stop layer 103 may be comprised of silicon nitride. In other cases, the dielectric layer 102 and possibly the etch stop layer 103 may be comprised of a so-called low-k dielectric having a permittivity that is significantly lower than that of silicon dioxide and silicon nitride. In the dielectric layer 102, openings 105 are formed as vias and trenches. The dimensions of the openings 105 as well as the spacing and their position on a die area of the substrate 101 are determined by the circuit design of a corresponding integrated circuit. The dielectric layer 102 may further include an opening 104 provided as a relatively wide trench. Moreover, the dielectric layer 102 may contain a substantially non-patterned region 106. As with the openings 105, the dimension and the position of the trench 104 and of the non-patterned region 106 is substantially determined by the circuit design.

The methods for forming the semiconductor device 100 as depicted in FIG. 1*a* are well established in the art and may include well-known deposition, lithography and etch techniques. In particular, the opening 105 may be formed in a first selective etch step within the dielectric layer 102, wherein the etch process stops on or in the etch stop layer 103. The opening 105 may then be formed in the etch stop layer 103 by a separate etch process designed to selectively remove the material of the layer 103. Thereafter, in a further etch step, the upper portion of the opening 105 and the opening 104 may be formed in a common etch step.

FIG. 1*b* schematically shows the semiconductor device 100 in an advanced manufacturing stage with a metal layer, such as copper layer 107, formed over the dielectric layer 102, wherein a barrier layer and a seed layer, which for convenience are commonly denoted by 108, is disposed between the metal layer 107 and the dielectric layer 102. The barrier/seed layer 108 may be comprised of two or more sub-layers containing materials such as tantalum, tantalum nitride, titanium, titanium nitride, combinations thereof, and the like. The seed layer may be comprised of, for example, copper.

The barrier/seed layer 108 may be formed by chemical vapor deposition, atomic layer deposition or physical vapor deposition followed by, for example, a sputter deposition process to form the seed layer as the final sub-layer of the barrier/seed layer 108. Thereafter, the metal layer 107 is deposited, wherein, as previously noted in context with copper, a wet-chemical process may preferably be employed so as to effectively provide large amounts of metal at reasonable deposition rates. For copper, electroplating is typically the presently preferred deposition method due to an increased deposition rate and a moderately complex electrolyte bath compared to electroless plating.

For reliable metal interconnects, it is not only important to deposit the copper as uniformly as possible over the entire surface of a 200, or even 300, mm diameter substrate, but it is also important to reliably fill the openings 105 and 104 that may have an aspect ratio of approximately 10:1, without any voids or defects. As a consequence, it is essential to deposit the copper in a highly non-confornmal manner. Accordingly, great efforts have been made to establish an electroplating technique that allows a highly non-conformal deposition of a metal, such as copper, in which openings, especially the small-sized vias and trenches 105, are filled substantially from bottom to top. It has been recognized that such a fill-in behavior may be obtained by controlling the deposition kinetics within the openings 105, 104 and on the horizontal portions, such as the non-patterned region 106. This is commonly achieved by introducing additives into the electrolyte bath to influence the rate of copper ions that deposit on the respective locations. For example, an organic agent of relatively large, slow-diffusing molecules, such as polyethylene glycol, may be added to the electrolyte and preferentially absorbs on flat surface and comer portions. Hence, contact of copper ions at these regions is reduced and thus the deposition rate is decreased. A correspondingly acting agent is also often referred to as a "suppressor." On the other hand, a further additive, including smaller and faster-diffusing molecules, may be used that preferentially absorbs within the openings 105, 104 and enhances the deposition rate by offsetting the effects of the suppressor additive. A corresponding additive is often also referred to as an "accelerator." In addition to using an accelerator and a suppressor, so-called levelers or brighteners are used to strive to reach a high degree of uniformity and to enhance the surface quality of the metal layer 107. Moreover, a simple DC deposition, i.e., deposition by supplying a substantially constant current, may not suffice to achieve the required deposition behavior despite the employment of accelerator, suppressor and/or leveler additives. Instead, the so-called pulse reverse deposition has become a preferred operation mode in depositing copper. In the pulse reverse deposition technique, current pulses of alternating polarity are applied to the electrolyte bath so as to deposit copper on the substrate during forward current pulses and to release a certain amount of copper during reversed current pulses, thereby improving the fill capability of the electroplating process. By these complex plating processes, the openings 105, 104 may be reliably filled with copper. It turns out, however, that the finally-obtained topography of the metal layer 107 depends on the underlying structure. Despite the employment of the pulse reverse method and a sophisticated chemistry including varying amounts of suppressors, accelerators and levelers, an enhanced deposition of metal is obtained over patterned regions, such as the openings 104, 105, as opposed to the non-patterned region 106. It is believed that a non-uniform distribution of the additives, especially of the accelerators in the vicinity of the openings 104, 105, leads to a further continuation of the deposition kinetics occurring within the openings 104, 105 even if these openings are already completely filled, thereby causing an enhanced deposition rate at these areas until finally the additives are uniformly distributed.

The structure-dependent topography of the metal layer 107 may then lead to process non-uniformity during a subsequent chemical mechanical polishing (CMP) process, since exposed areas of the metal layer 107 may experience an increased downforce, as indicated by arrows 109, during the polishing process. The removal process, therefore, preferably starts over the openings 104, 105 and may continue at a higher removal rate compared to the non-patterned region 106. Consequently, clearing of the surface of the region 106 is delayed and a substantial "overpolish" time is required to substantially completely remove any metal residues from the region 106. This may cause an increased material removal in the openings 104, 105, which is also referred to as "dishing," and may also lead to increased removal of dielectric material of the layer 102 in the vicinity of the openings 104, 105, also known as erosion. In addition to these deleterious effects, the non-uniformity of the metal removal may also affect any endpoint detection methods, such as methods based on optical signals obtained by light reflected from the metal layer 107 during the polish process, based on the motor current required to establish a relative motion between the substrate 101 and a polishing pad, or based on other friction related or otherwise generated endpoint signals. That is, the corresponding endpoint signals may exhibit a less steep slope and may therefore exacerbate the assessment of the end of the polishing process. Since CMP is in itself a highly complex process, the final result of the polishing process and hence the quality of the metal lines formed in the openings 104, 105 not only depends on the CMP parameters but is also strongly influenced by the properties of the metal layer 107. For these reasons, it is frequently proposed to provide a "dummy" pattern in the non-patterned region 106 so as to achieve similar deposition conditions as over the openings 104, 105. Although this approach may significantly relax the above-identified non-uniformity issues, the additionally generated metal regions may add parasitic capacitance to the circuit, thereby reducing the operating speed thereof, and may in many cases render this solution less than desirable.

In view of the above-mentioned problems, a need exists to provide an electroplating process that minimizes the burden on the subsequent CMP process.

SUMMARY OF THE INVENTION

Generally, the present invention is directed to methods that may improve the uniformity of a CMP process in that a preceding sequence for forming a plated metal layer is modified so as to provide a significant surface roughness of the metal layer at least over non-patterned portions of a substrate. In this way, the beginning of the material removal during CMP in the non-patterned portions is not delayed as in conventional techniques.

According to one illustrative embodiment of the present invention, a method of depositing a metal layer over a substrate including a dielectric layer having a patterned region and a non-patterned region formed therein is provided. The method comprises exposing the substrate to an electrolyte bath so as to non-conformally deposit metal in a bottom-to-top technique in the patterned region. Then, an excess metal layer is formed over the patterned region and the non-patterned region. Moreover, at least one process parameter is controlled during the formation of the excess metal layer to adjust a surface roughness of the excess metal layer.

According to another illustrative embodiment of the present invention, a method of forming a metallization layer of a semiconductor device is provided. The method comprises providing a substrate having formed thereon a dielectric layer with a first region and a second region, wherein the first region includes vias and trenches to be filled with a metal, and wherein the second region is substantially devoid of trenches and vias to be filled with metal. The substrate is exposed to an electrolyte bath to fill the vias and trenches in the first region and to form an excess metal layer over the first and the second regions. Thereby, a surface roughness at least of the second region is adjusted to be greater than approximately 50 nm. Finally, the excess metal layer is removed by chemical mechanical polishing, wherein the surface roughness promotes the beginning of material removal during the chemical mechanical polishing process.

According to still a further illustrative embodiment of the present invention, a method comprises determining a surface roughness of a metal layer formed over a dielectric including a patterned region and a substantially non-patterned region. A portion of the metal layer is then removed by chemical mechanical polishing to expose the dielectric in the patterned and non-patterned regions, and an endpoint detection signal is monitored during the chemical mechanical polishing. Finally, the monitored endpoint detection signal is related to the determined surface roughness to determine an optimum surface roughness for a desired signal/noise ratio of the endpoint detection signal.

According to yet another illustrative embodiment of the present invention, a method comprises determining a surface roughness of a metal layer formed over a dielectric including a patterned region and a substantially non-patterned region and removing a portion of the metal layer by chemical mechanical polishing to expose the dielectric in the patterned and non-patterned regions. A polishing time is monitored that is required for substantially completely clearing the patterned and non-patterned regions, and the monitored polishing time is related to the determined surface roughness to determine a surface roughness that results in a reduced polishing time.

BRIEF DESCRIPTION OF THE DRAWINGS

The invention may be understood by reference to the following description taken in conjunction with the accompanying drawings, in which like reference numerals identify like elements, and in which.

Figure 1A:
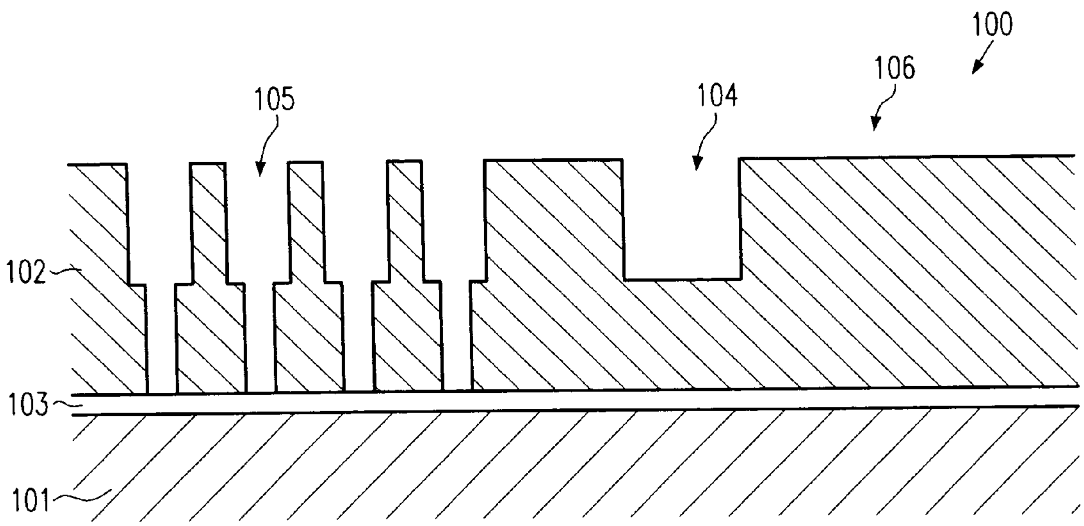
FIGS. 1_a_–1_b_ schematically show cross-sectional views of a semiconductor device during various prior art manufacturing stages when receiving a copper metallization layer.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present invention is based on the finding that, opposed to conventional teaching, a pronounced roughness of the surface of a metal layer plated over a dielectric that is structured to include trenches and vias as well as non-patterned regions in accordance with the circuit design may significantly relax the burden placed upon a subsequent CMP process. The pronounced surface roughness may promote the start of material removal to occur more uniformly across the substrate irrespective whether a patterned or a non-patterned region is formed below the metal layer.

Figure 1B:
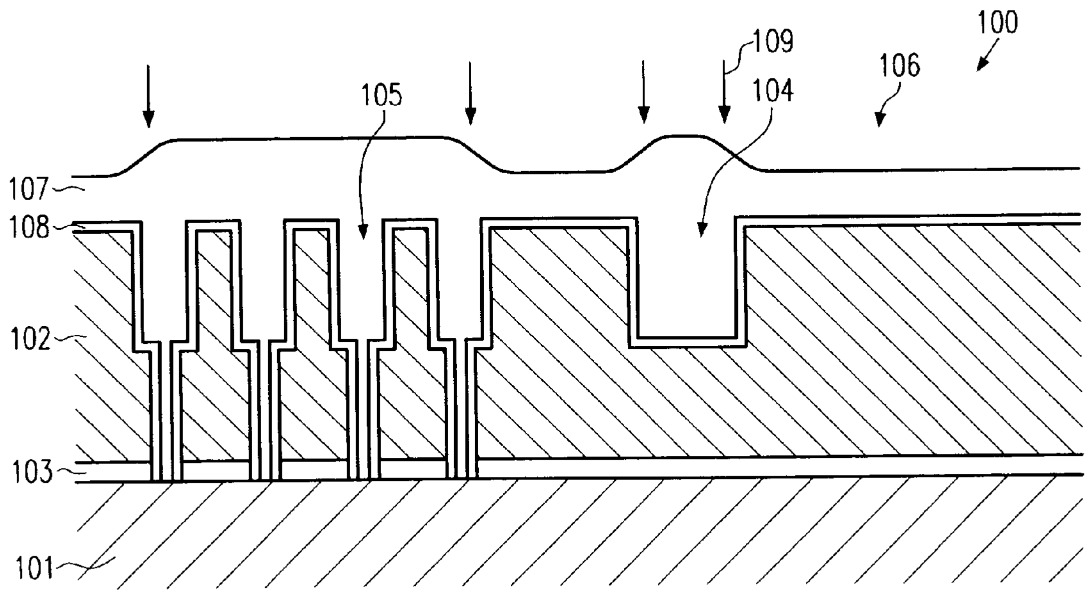

With reference to FIGS. 2_a_–2_c_, 3 and 4, further illustrative embodiments of the present invention will now be described, wherein, for the sake of simplicity, FIG. 1_a_ is also referred to where appropriate. Moreover, in the following illustrative embodiments, copper is referred to as the metal to be deposited by an electrochemical deposition method, such as electroplating, since copper, as previously noted, is expected to be mainly used in future sophisticated integrated circuits, and the embodiments described hereinafter are particularly advantageous for electroplating copper during the fabrication of metallization layers having vias and trenches with a diameter as small as 0.1 $\mu$m and even less. The present invention is, in principle, also applicable to other metals and metal compounds and metal alloys, and the teaching provided herein enables a skilled person to modify any processes and parameters specified below so as to adapt the embodiments described herein to the specific metal.

Figure 2A:
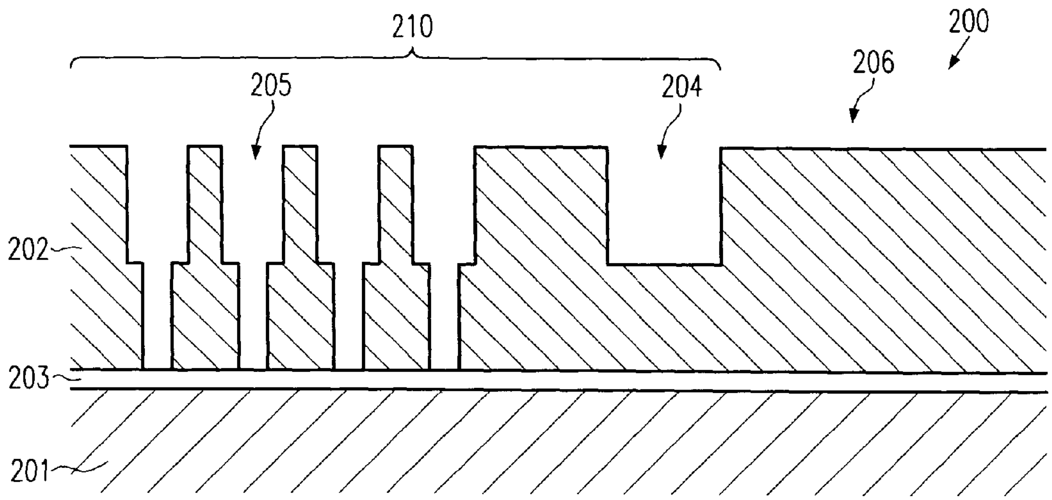
FIGS. 2_a_–2_c_ schematically show cross-sectional views of a device with a metal layer formed over a dielectric layer having a patterned and a non-patterned region according to illustrative embodiments of the present invention.

FIG. 2*a* schematically depicts a cross-sectional view of a semiconductor device 200 during the fabrication of a metallization layer. The semiconductor device may be similar to the device 100 described in FIG. 1*a,* wherein corresponding components are denoted by the same reference numerals except for a leading "2" instead of a "1." Hence, the device 200 comprises the substrate 201 having formed thereon the etch stop layer 203 followed by the dielectric layer 202. The vias and trenches 205 and the wide trench 204 commonly define a first patterned region 210. Adjacent to the first region 210 is the substantially non-patterned region 206. The region 206 is designated as substantially non-patterned to indicate that few, if any, trenches are formed in the region 206 relative to the number of trenches formed in the patterned region 210. It may be the case that some trenches (not shown) are formed in the region 206 but, due to the relatively small number of such trenches and/or the relatively small area occupied by such trenches, the region 206 behaves, with respect to the deposition of the metal layer, substantially like an area without trenches formed therein. In a typical process flow for manufacturing the device as depicted in FIG. 2*a,* substantially the same processes may be performed as are described with reference to FIG. 1*a*.

Figure 2B:
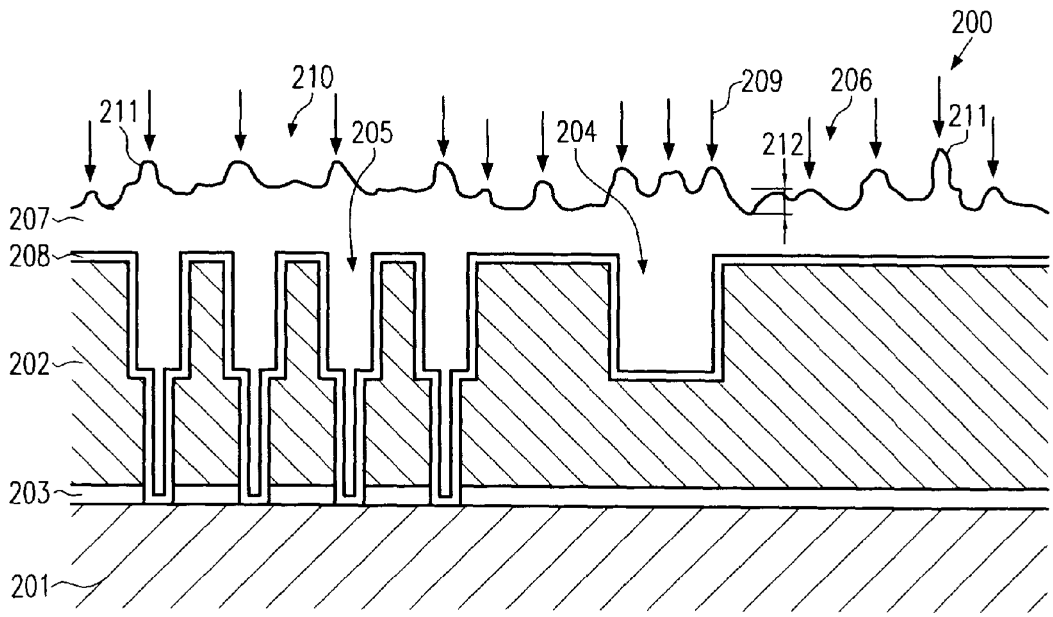

FIG. 2*b* schematically shows the device 200 in an advanced manufacturing stage, wherein a copper layer 207 is formed over the first and second region 210, 206 with a barrier/seed layer 208 disposed therebetween. The barrier/seed layer 208 may be comprised of materials that effectively prevent copper from diffusing into adjacent materials and also provide for sufficient adhesion of copper to the surrounding dielectric and any potential metal the vias 105 may connect to. Presently preferred materials are tantalum and tantalum nitride and combinations thereof, while any other suitable materials may be used if considered appropriate. In the embodiment described herein, the seed layer may be a layer of copper deposited by a PVD process.

In one particular embodiment, the copper layer 207 comprises a pronounced surface roughness, indicated by 211, that is distributed across the first and second regions 210, 206. An average height of the surface roughness is denoted as 212 and may exceed approximately 50 nm. In other embodiments, the average height 212, which may simply be referred to as average surface roughness, may range from about 50–400 nm, and in other embodiments from about 150–250 nm.

A typical process flow for forming the device of FIG. 2*b* may include the following processes. First, the barrier/seed layer 208 may be formed by a similar process as already described with reference to the barrier/seed layer 108 shown in FIG. 1*b*. In particular, the barrier/seed layer 208 may be formed as a stack of two or more sub-layers to provide for the desired functionality of the barrier/seed layer 208, wherein CVD, PVD, ALD (atomic layer deposition), plating processes, and any combinations of these processes may be used. Then, the substrate 201 or at least the dielectric layer 202 is exposed to an electrolyte bath (not shown) that may be provided in a commonly known plating reactor, such as an electroplating reactor available from Semitool Inc. under the name LT210C™. It should be noted that the present invention may be applied to any electroplating reactor. In one illustrative embodiment, the electrolyte bath includes an accelerator additive and a suppressor additive in an amount of approximately 1–5 wt % and about 1–5 wt %, respectively, with regard to the total amount of the electrolyte bath. Contrary to conventional electroplating baths including about 1 wt % of leveler or more, the amount of a leveler or brightener is significantly reduced to approximately less than 0.1 wt %. In one embodiment, the leveler may be substantially completely omitted. It should be noted that the terms leveler and brightener are used synonymously and shall indicate an additive that acts to smooth the surface of the copper layer 207 when applied as in the conventional technique. Moreover, any of the commonly known accelerator, suppressor and leveler compounds may be used in accordance with the present invention. The accelerator may, for example, be comprised of propane sulfonic acid. The suppressor may, for example, be comprised of a polyalkylene glycol type polymer. Typical levelers may, for example, be comprised of polyether. During the exposure of the substrate to the electrolyte bath, a current of appropriate wave form may be applied to accomplish the fill of the openings 205, 204 in a bottom-to-top fashion, thereby substantially avoiding the formation of voids and seams within the openings 205, 204. For example, well-established pulse reverse sequences may be performed to reliably fill the openings 205, 204. As previously explained, the reliable fill of especially the wide trenches 204 across a 200, or even a 300, mm substrate requires a certain "overplating," which leads to the formation of an excess layer on the first and second regions 210, 206. In this embodiment, during the formation of the excess copper layer, the amount of leveler is controlled, for example, by dosing the amount of leveler during the preparation of the electrolyte bath in such a manner that the average surface roughness 212 is obtained.

In other embodiments, an electroless deposition may be carried out, wherein the amount of the leveler is controlled in a manner as described with reference to the electroplating process, to thereby create the average surface roughness 212.

After the deposition of the copper layer 207, the substrate may be annealed to enhance the granularity of the copper, that is, to increase the grain size of copper crystallites, thereby improving the thermal and electrical conductivity.

Thereafter, the substrate 201 is subjected to a CMP process to remove excess material of the layer 207 and the barrier/seed layer 208 so as to expose the dielectric layer 202 for providing electrically insulated copper lines. The CMP process may be performed in any appropriate CMP tool as are well-known in the art. During the initial phase of the CMP process, the downforce applied to the substrate 201 is exerted to a plurality of the elevations 211 in the first and the second regions 210, 206, and, therefore, material removal is initiated also in the second region 206. Consequentially, the discrepancy of removal times between the first and the second regions 210, 206 may be remarkably reduced compared to the conventional approach described earlier. In one illustrative embodiment, the CMP process is carried out while monitoring an endpoint detection signal. An endpoint detection signal may be generated by detecting light that is reflected from the substrate 201 during the polish process. In other cases, the motor current, or any other signal representative for the motor torque, that is required for maintaining a specified relative motion between the substrate 201 and a respective polishing pad may be used to assess the progress of the polishing process, since different materials typically exhibit different frictional forces. For instance, when a substantial portion of the second region 206 is already cleared, the motor current may decrease for a given revolution speed, since the barrier/seed layer 208 may have a lower coefficient of friction than copper. Irrespective of the method for establishing the endpoint detection signal, the end of the polishing process may be estimated on the basis of this signal. Due to the increased uniformity of the material removal in accordance with the present invention, the endpoint detection signal may be used to more reliably estimate the polishing process.

Figure 3:
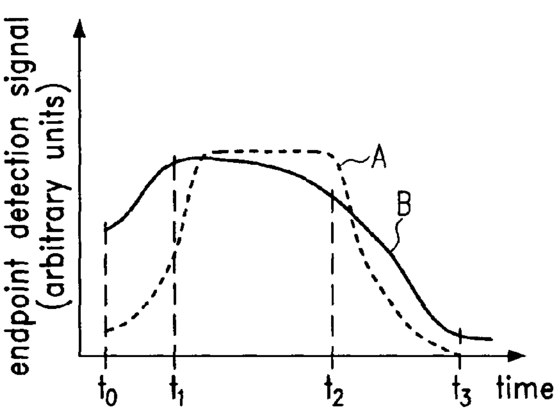
FIG. 3 is a schematic graph representing the relationship of a CMP endpoint detection signal for a metal layer with and without a surface roughness.

FIG. 3 illustrates an exemplary graph in which an endpoint signal is plotted versus the polishing time. For convenience, in the diagram of FIG. 3, representative smoothed curves of an optical endpoint detection system are depicted; however, the following considerations may readily be applied to curves created by any other endpoint detection system. A first curve A (dashed line) represents the amplitude of an optical endpoint detection signal for the substrate 201 having the pronounced surface roughness 211, whereas a second curve B (solid line) represents the endpoint detection signal obtained by a conventionally processed substrate, such as the substrate 101 in FIG. 1*b*. At time point $t_0$, the polish process may start and, for a metal layer formed in accordance with conventional processing techniques (curve B), the initial reflectance may be relatively high due to the high reflectance of copper. As the polish process progresses to time point $t_1$, the reflectance may still slightly increase as the surface of the substrate 101 becomes increasingly even, thereby reducing scattered light. At time point $t_2$, surface portions may become cleared and the total reflectivity is reduced, thereby decreasing the endpoint detection signal. Since the beginning of substantial material removal may be delayed in the non-patterned region 106, the slope of curve B is relatively low until, at time point $t_3$, the endpoint detection signal indicates that substantially all metal residues are removed. Thereafter, a further overpolish time may be added to assure the reliable electrical insulation of the metal lines formed in the openings 105, 104.

Contrary thereto, curve A may start at a relatively low magnitude due to relatively low reflectance of the substrate 201 caused by the surface roughness 211. The optical appearance of the metal layer 207 may be hazy or milky after deposition. During the polish process, the roughness 211 is reduced, wherein the material removal also occurs at the non-patterned region 206 due to the plurality of locations of increased downforce 209. Therefore, the endpoint detection signal rises and may reach a maximum between time points $t_1$ and $t_2$. Thereafter, clearance of surface portions occurs at significantly larger areas compared to the conventional case, resulting in steeper slope of curve A between time points $t_2$ and $t_3$. Due to the steeper slope of curve A, the end of the polish process may be assessed more reliably. Moreover, the overpolish time and thus the total polish time may be reduced. It should further be noted that, in general, although not shown in the representative curves A and B, the signal/noise ratio of curve A in the time interval $t_1$–$t_2$ is enhanced due to the increased steepness of curve A.

In one illustrative embodiment, a relation may be established that expresses the correlation of the endpoint detection signal to the average surface roughness 212. To this end, a plurality of substrates 201, in the form of product substrates and/or test substrates, may be processed with substantially identical CMP process parameters, wherein the average surface roughness 212 may be varied and related to the corresponding endpoint detection signal. The average surface roughness may be determined by mechanical, optical, mechanical/optical roughness measurement instruments, by electron microscopy, by atomic force microscopy, and the like.

Figure 4:
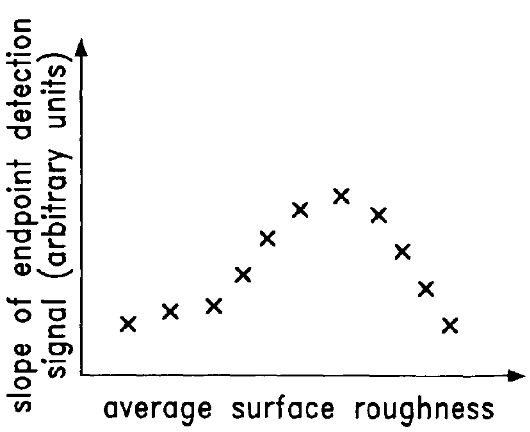
FIG. 4 is a schematic graph representing the relationship between the slope of the endpoint detection signal and the average surface roughness of a metal layer.

FIG. 4 illustrates a representative example for a relation between the slope of the endpoint detection signal and the average surface roughness 212. In the diagram, the magnitude of the slope of the endpoint detection signals, at one or more representative points within an appropriate interval, for example the interval $t_1$, $t_2$, is determined and plotted versus the average surface roughness 212. From this relation, an appropriate average surface roughness may be extracted, which is then used as a target value in creating the surface roughness 211. For instance, in FIG. 4, the maximum may be defined as the target value for the average surface roughness. However, any other criterion may be employed for obtaining the target value. In other embodiments, the total time of the polishing process, that is, the time from the beginning of the polish process until the endpoint detection signal has reached a specified minimal value, may be related to the average surface roughness. An appropriate target value may then be selected on the basis of this relationship. For instance, if the obtained relationship exhibits a minimum, this minimum total polish time may indicate the appropriate surface roughness.

In some embodiments, the average surface roughness 212 may be varied or controlled by controlling at least one process parameter of the plating process described earlier. In a particular embodiment, the amount of leveler in the plating bath may be adjusted so as to vary the average surface roughness 212 for establishing the relationship as described above with reference to FIGS. 3 and 4. Once the relationship, and thus a target value for the average surface roughness, is obtained, at least one process parameter, such as the leveler concentration, may be controlled in accordance with the target value.

Figure 2C:
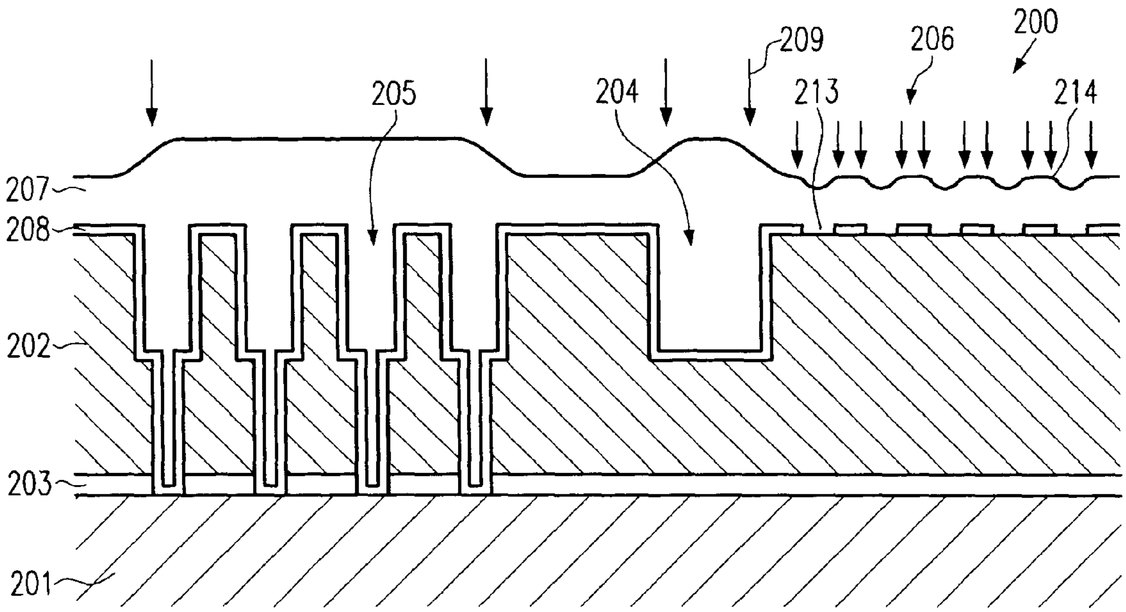

With reference to FIG. 2*c*, further illustrative embodiments are described for forming a surface roughness at least over non-patterned regions of a dielectric layer. After forming the device 200 as depicted in FIG. 2*a*, the device 200 in FIG. 2*c* may be formed in a similar fashion as described with reference to FIG. 2*b*, wherein, however, a pattern 213 is formed over the non-patterned region 206 of the dielectric layer 202. In one embodiment, the pattern 213 may be formed in the barrier/seed layer 208 by, for example, an additional lithography and etch step. The pattern 213 may be formed in a screen or grid like manner so as to provide electrical contact between neighboring elements of the pattern 213. In this way, the current distribution during an electroplating process is only slightly modified and may only negligibly affect the overall electroplating process. In other embodiments, the pattern 213 may only be provided at the utmost sublayer of the barrier/seed layer 208, which typically acts as a seed layer. In this case, the current distribution at the initial phase of the plating process may remain substantially unaffected. In a further example, the pattern 213 may be provided as an additional resist pattern formed on the otherwise intact barrier/seed layer 208.

After the pattern 213 is formed, the plating process is performed, wherein standard bath recipes and process recipes may be used. Due to the pattern 213, the copper deposition is modified in accordance with the underlying pattern 213, resulting in the creation of a surface roughness 214. Thereafter, further processing of the substrate 201 may be continued as is described with reference to FIG. 2*b*. During the CMP process, material removal also starts at the region 206 including the non-patterned dielectric layer 202 so that substantially the same advantages are achieved as in the previously described embodiments. Moreover, regarding the formation of an appropriate surface roughness 214 with respect to an average height and/or pitch, all of the criteria pointed out with reference to FIGS. 3 and 4 may be applied to the embodiments described above with reference to FIG. 2*c*.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method of depositing a metal over a substrate including a dielectric layer having a patterned region and a substantially non-patterned region formed therein, the method comprising:

exposing said substrate to an electrolyte bath so as to non-conformally deposit metal in a bottom-to-top technique in said patterned region;

forming an excess metal layer over said patterned region and said substantially non-patterned region;

controlling at least one process parameter during the formation of said excess metal layer to adjust a surface roughness of said excess metal layer;

removing said excess metal layer by chemical mechanical polishing using an endpoint detection signal;

exposing a second substrate that is substantially identical to said substrate to said electrolyte bath so as to non-conformally deposit metal in a bottom-to-top technique in said patterned region;

forming an excess metal layer over said patterned region and a substantially non-patterned region of said second substrate; and based on said endpoint detection signal, controlling at least one process parameter during the formation of said excess metal layer of said second substrate to adjust a surface roughness of said excess metal layer of said second substrate.

2. The method of claim 1, wherein said excess metal layer is formed in said electrolyte bath and said at least one process parameter represents the concentration of a leveler affecting the surface quality of a metal layer formed in said electrolyte bath.

3. The method of claim 1, wherein said electrolyte bath is a bath configured for electroplating.

4. The method of claim 1, wherein a steepness of a slope of said endpoint detection signal is used for controlling said at least one process parameter.

5. The method of claim 1, wherein said metal comprises copper.

6. The method of claim 1, wherein said patterned region includes vias having a diameter of approximately 0.1 $\mu$m or less.

7. The method of claim 1, wherein a surface roughness above said patterned region and a surface roughness above said substantially non-patterned region are approximately equal.

8. A method of forming a metallization layer of a semiconductor device, the method comprising:

providing a substrate having formed thereon a dielectric layer with a first region and a second region, said first region including vias and trenches to be filled with a metal, said second region being substantially devoid of trenches and vias to be filled with metal;

exposing said substrate to an electrolyte bath to fill said vias and trenches in said first region and to form an excess metal layer over said first and second regions, wherein a surface roughness at least of said second region is adjusted to be higher than approximately 50 nm; and removing said excess metal layer by chemical mechanical polishing, wherein said surface roughness of said metal layer above at least said second region promotes the removal of said excess metal layer above at least said second region during said chemical mechanical polishing process.

9. The method of claim 8, further comprising generating an endpoint detection signal during said chemical mechanical polishing of said substrate and stopping said chemical mechanical polishing on the basis of said endpoint detection signal.

10. The method of claim 8, wherein said surface roughness is adjusted by controlling at least one process parameter during the exposure of said substrate to the electrolyte bath.

11. The method of claim 10, wherein said at least one process parameter represents the concentration of a leveler affecting the surface quality of a metal layer formed in said electrolyte bath.

12. The method of claim 9 or 10, further comprising establishing a relation between said surface roughness and said endpoint detection signal.

13. The method of claim 12, wherein said relation is determined by a slope of said endpoint detection signal.

14. The method of claim 12, further comprising processing a second substrate that is substantially identical to said substrate by exposing said second substrate to said electrolyte bath, wherein a surface roughness of a second region of said second substrate is adjusted on the basis of said relation between said surface roughness and said endpoint detection signal.

15. The method of claim 8, further comprising forming a barrier layer and a seed layer prior to exposing said substrate to said electrolyte bath.

16. The method of claim 15, further comprising forming a pattern in said barrier layer and said seed layer in said second region to adjust said surface roughness in said second region during exposure to said electrolyte bath.

17. A method, comprising:

determining a surface roughness of a metal layer formed over a dielectric including a patterned region and a substantially non-patterned region;

removing a portion of said metal layer by chemical mechanical polishing to expose said dielectric in said patterned and non-patterned regions;

monitoring an endpoint detection signal during said chemical mechanical polishing; and relating said monitored endpoint detection signal to said determined surface roughness to determine an optimum surface roughness for a desired signal/noise ratio of said endpoint detection signal.

18. A method, comprising:

determining a surface roughness of a metal layer formed over a dielectric including a patterned region and a substantially non-patterned region;

removing a portion of said metal layer by chemical mechanical polishing to expose said dielectric in said patterned and non-patterned regions;

monitoring a polishing time for substantially completely clearing said patterned and non-patterned regions; and relating said monitored polishing time to said determined surface roughness to determine a surface roughness that results in a reduced polishing time.

* * * * *